US006953997B1

(12) United States Patent
Merigot et al.

(10) Patent No.: US 6,953,997 B1
(45) Date of Patent: Oct. 11, 2005

(54) SEMICONDUCTOR DEVICE WITH IMPROVED BONDING PAD CONNECTION AND PLACEMENT

(75) Inventors: Vincent Merigot, Hsinchu (TW); Ming Hsien Tsai, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 10/861,805

(22) Filed: Jun. 4, 2004

(51) Int. Cl.[7] .............................................. H01L 23/48
(52) U.S. Cl. ...................... 257/773; 257/203; 257/786
(58) Field of Search ............................... 257/203, 734, 257/773, 786

(56) References Cited

U.S. PATENT DOCUMENTS

| 5,796,171 A | | 8/1998 | Koc et al. |
| 6,100,573 A | | 8/2000 | Lu et al. |
| 6,150,727 A | * | 11/2000 | Takagi .......................... 257/786 |
| 6,191,491 B1 | * | 2/2001 | Hiraga ......................... 257/784 |
| 6,710,448 B2 | | 3/2004 | Wang |
| 6,768,142 B2 | * | 7/2004 | Ali et al. ...................... 257/203 |
| 6,784,558 B2 | * | 8/2004 | Jassowski .................... 257/786 |

* cited by examiner

Primary Examiner—Gene M. Munson
(74) Attorney, Agent, or Firm—Haynes and Boone, LLP

(57) ABSTRACT

A semiconductor apparatus includes a substrate with a peripheral edge. A plurality of devices are situated on the substrate and adjacent the peripheral edge, with each device including a first end adjacent the peripheral edge and a second end opposite the first end. A connector port is located between the first end and the second end on each device. A bonding pad is situated atop a portion of each device and coupled to each device by a connector connected to the connector port. Each connector has a connection path of approximately equal length.

21 Claims, 2 Drawing Sheets

SEMICONDUCTOR DEVICE WITH IMPROVED BONDING PAD CONNECTION AND PLACEMENT

BACKGROUND

This disclosure relates generally to semiconductor manufacturing, and more particularly to bonding pads on a semiconductor apparatus.

Signals on a chip in a semiconductor apparatus enter and leave by way of bonding pads, which are connected to a given device by connectors located on an edge of the device. The placement and connection of these bonding pads raise a number of issues.

In a linear approach, the devices are placed side by side, abutting each other. The devices are positioned so that the connector on the edge of each device faces the outer edge of the chip. The bonding pads are lined up in an area between the outer edges of the devices and the outer edge of the chip, and each bonding pad is connected to a device. This approach is undesirable because the area between the outer edges of the devices and the outer edge of the chip must be dedicated to bonding pad placement, and the number of bonding pads that can be placed in such configuration is limited.

One alternative is a staggered approach, where the devices are again placed side by side, abutting each other, with the devices positioned so that the connector on the edge of each device faces the outer edge of the chip. The device width is made smaller than in the linear approach, allowing the bonding pads to be staggered, creating an area between the outer edges of the devices and the outer edge of the chip where there exists a first row of bonding pads and a second row of bonding pads, each connected to a device. This approach allows more bonding pads to be used. However, even more area between the outer edges of the devices and the outer edge of the chip is dedicated to bonding pad placement compared to the linear approach. Further, the connections of the connectors to the bonding pads differs depending on which row a bonding pad is located in. The first row, closest to the devices and their connectors, has a short and strong connection path. The second row, farther away from the devices and their connectors, has a longer connections path that is weaker, which can result in signal deterioration.

Another alternative is a Circuit Under Pad (CUP) approach, where the devices are again placed side by side, abutting each other, with the devices positioned so that the connector on the edge of each device faces the outer edge of the chip. The bonding pads are then placed above the device, allowing the device edge to extend to the outer edge of the chip. This results in no lost area on the chip that must dedicated to bonding pad placement. However, in order to allow placement of a maximum number of bonding pads, the device width is again made smaller than in the linear approach, allowing the bonding pads to be staggered in their placement above the devices. This results in a first row of bonding pads and a second row of bonding pads, each connected to the device. Once again, the connections of the connectors to the bonding pads differs depending on which row a bonding pad is located in. The first row, closest to the connectors on the devices, has a short and strong connection path. The second row, farther away from the connectors on the devices, has a longer connection path that is weaker, which can result in signal deterioration if there is no increase in the number of metal layers. This also requires dedicating some of the device metal routing for the bonding pads as well as the connections.

Accordingly, it would be desirable to provide an improved method for placement and connection of bonding pads absent the disadvantages found in the prior methods discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
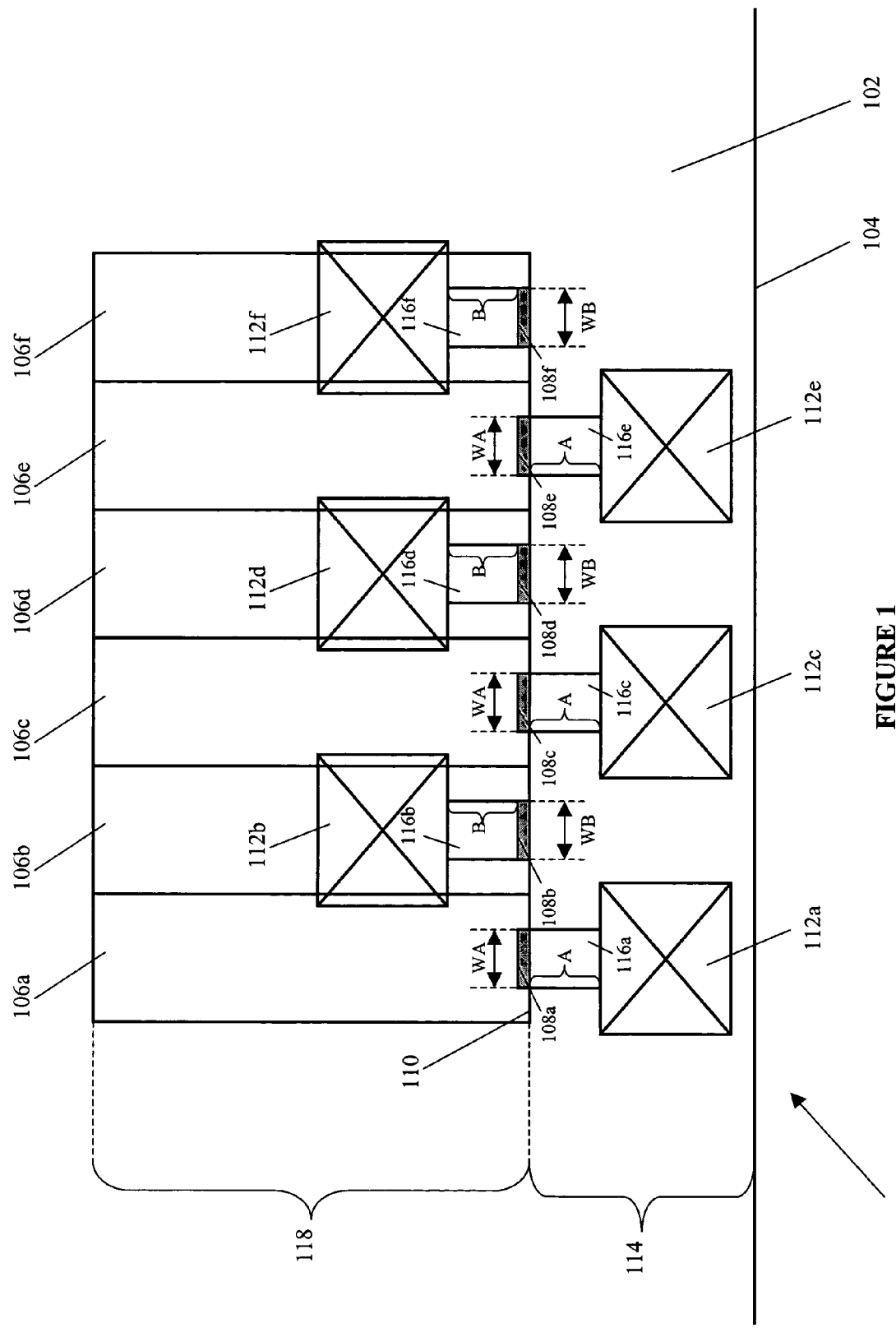
FIG. 1 is a top view illustrating an embodiment of a plurality of devices on a substrate with bonding pads connected to the devices.

In one embodiment, a semiconductor apparatus 100, FIG. 1, includes a substrate 102 with a peripheral edge 104. A plurality of devices, for example devices 106a, 106b, 106c, 106d, 106e, and 106f, are situated on substrate 102. Devices 106a–f can include I/O devices. Each respective device 106a–f includes a respective connector port 108a–f located on a device end 110 (shown on device 106a alone for clarity). A plurality of bonding pads, for example pads 112a, 112c, and 112e, are situated adjacent peripheral edge 104 in a region 114 on substrate 102 that is substantially clear of devices such as devices 106a–f. Bonding pads 112a, 112c, and 112e are coupled to their respective devices 106a, 106c, and 106e through respective connector ports 108a, 108c, and 108e by respective connectors 116a, 116c, and 116e. Connectors 116a, 116c, and 116e each have a connection path of length A and width WA. In one embodiment, connectors 116a, 116c, and 116e can be formed utilizing a plurality of metals layers, for example five metal layers, on semiconductor apparatus 100. A plurality of bonding pads, for example pads 112b, 112d, and 112f, are situated inward the plurality of bonding pads 112a, 112c, and 112e in a region 118 on substrate 102 that is substantially covered by devices such as devices 106a–f. Each bonding pad 112b, 112d, and 112f is situated atop a portion of its respective device 106b, 106d, and 106f, and coupled to its respective device 106b, 106d, and 106f though respective connector ports 108b, 108d, and 108f by respective connectors 116b, 116d, and 116f. Connectors 116b, 116d, and 116f each have a connection path of length B and width WB approximately equal to the length A and width WA of the connection paths 116a, 116c, and 116e. In one embodiment, connectors 116b, 116d, and 116f can be formed utilizing a plurality of metal layers, for example five metal layers, on semiconductor apparatus 100. Those skilled in the art will appreciate that the particular number of layers may vary according to the particular application.

Figure 2:
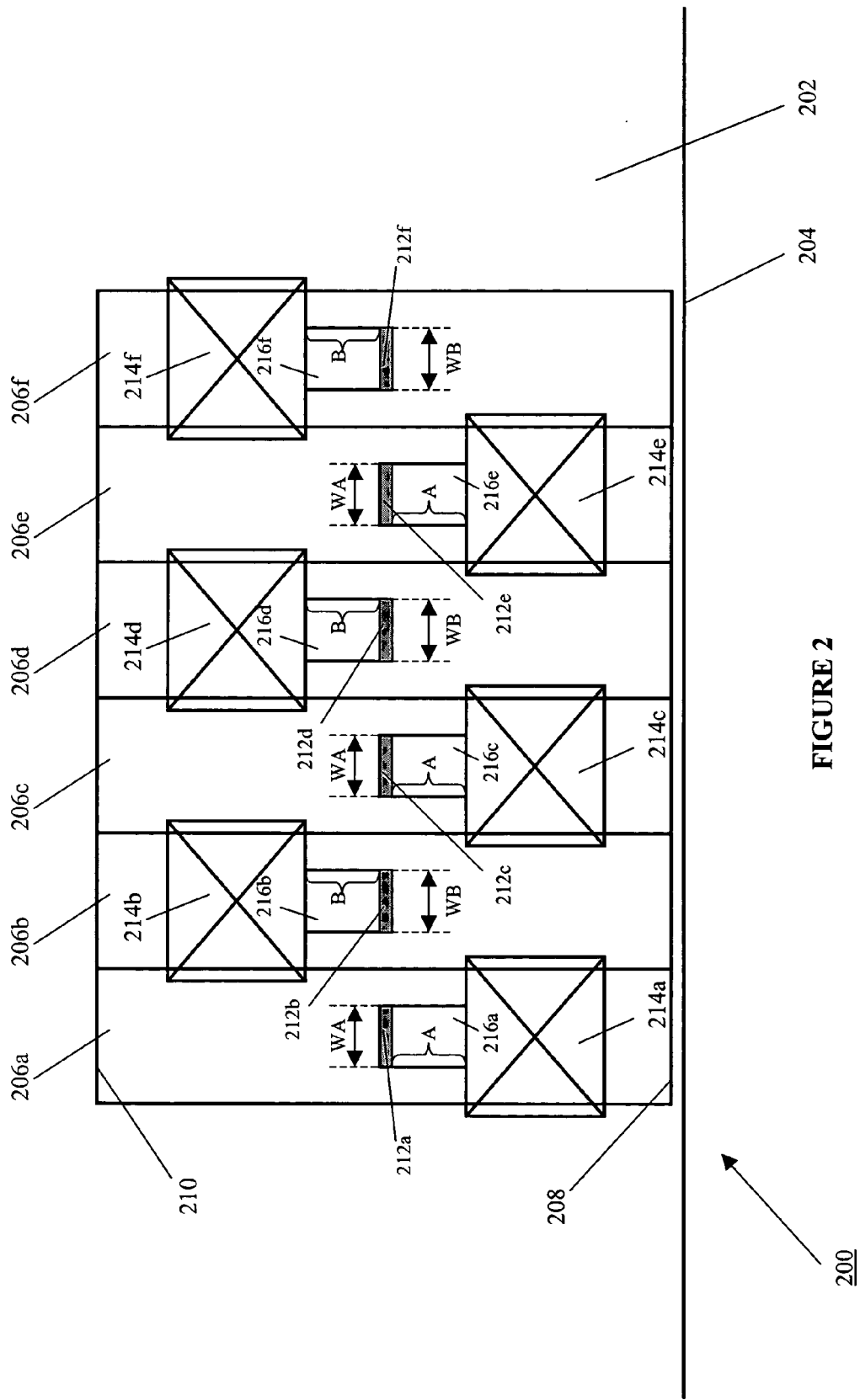
FIG. 2 is a top view illustrating another embodiment of a plurality of devices on a substrate with bonding pads connected to the devices.

In another embodiment, a semiconductor device 200, FIG. 2, includes a substrate 202 with a peripheral edge 204. A plurality of devices, for example devices 206a, 206b, 206c, 206d, 206e, and 206f, are situated on substrate 202 adjacent the peripheral edge 204. Devices 206a–f can include I/O devices. Each respective device 206a–f includes an end 208 (shown on device 206a alone for clarity) adjacent the peripheral edge 204, and an end 210 (shown on device 206a alone for clarity) opposite end 208. Each respective device 206a–f further includes a respective connector port 212a–f located between end 208 and end 210. A plurality of bonding pads, for example pads 214a, 214c, and 214e, are situated atop a portion of their respective devices 206a, 206c, and 206e, between end 208 and their respective connector port 212a, 212c, and 212e. Bonding pads 214a, 214c, and 214e are coupled to their respective devices 206a, 206c, and 206e through respective connector ports 212a, 212c, and 212e by respective connectors 216a, 216c, and 216e. Connectors 216a, 216c, and 216e each have a connection path of length A and width WA. In one embodiment, connectors 216a, 216c, and 216e can be formed utilizing a plurality of metal layers, for example five metal layers, on semiconductor apparatus 200. A plurality of bonding pads, for example pads 214b, 214d, and 214f, are situated atop a portion of their respective devices 206b, 206d, and 206f, between end 210 and their respective connector port 212b, 212d, and 212f. Bonding pads 214b, 214d, and 214f are coupled to their respective devices 206b, 206d, and 206f through respective connector ports 212b, 212d, and 212f by respective connectors 216b, 216d, and 216f. Connectors 216b, 216d, and 216f each have a connection path of length B and a width WB approximately equal to the length A and width WA of the connection paths 216a, 216c, and 216e. In one embodiment, connectors 216b, 216d, and 216f can be formed utilizing a plurality of metal layers, for example five metal layers, on semiconductor apparatus 200. Those skilled in the art will appreciate that the particular number of layers may vary according to the particular application.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A semiconductor apparatus comprising:
   a substrate including a peripheral edge;
   a plurality of devices situated on the substrate, each device including a connector port;
   a first plurality of bonding pads situated adjacent the peripheral edge of the substrate, each of the first plurality of bonding pads being coupled by a respective first connector to a respective connector port; and
   a second plurality of bonding pads situated on the substrate inward of the first plurality of bonding pads, each of the second plurality of bonding pads being situated atop a portion of the respective devices and being connected thereto by a respective second connector.

2. The semiconductor apparatus of claim 1 wherein the first connectors and the second connectors exhibit respective connection paths that are of approximately equal length.

3. The semiconductor apparatus of claim 2 wherein the connection paths include a plurality metal layers.

4. The semiconductor apparatus of claim 1 wherein the first plurality of bonding pads are located in a region of the substrate which is substantially clear of devices.

5. The semiconductor apparatus of claim 1 wherein the second plurality of bonding pads are located in a region of the substrate which is substantially covered with devices.

6. The semiconductor apparatus of claim 1 wherein the plurality of devices includes I/O devices.

7. The semiconductor apparatus of claim 1 wherein a plurality of the devices are situated adjacent each other on the substrate, whereby any two adjacent devices include a first device with one of the first plurality of bonding pads connected and a second device with one of the second plurality of bonding pads connected.

8. A semiconductor apparatus comprising:
   a substrate including a peripheral edge;
   a plurality of devices situated on the substrate, each device including a first end and a second end opposite the first end;
   each device including a connector port located between the first and second end of that device; and
   a plurality of bonding pads, each of the plurality of bonding pads being coupled by a respective connector to a connector port.

9. The semiconductor apparatus of claim 8 wherein the respective connectors exhibit respective connection paths that are of approximately equal length.

10. The semiconductor apparatus of claim 9 wherein the respective connection paths include a plurality of metal layers.

11. The semiconductor apparatus of claim 8 wherein the plurality of devices are located adjacent the peripheral edge of the substrate.

12. The semiconductor apparatus of claim 8 wherein the plurality of bonding pads are located atop a region of the substrate which is substantially covered with devices.

13. The semiconductor apparatus of claim 8 wherein the plurality of devices includes I/O devices.

14. The semiconductor apparatus of claim 8 wherein a plurality of the devices are situated adjacent each other on the substrate, whereby any two adjacent devices have their respective bonding pads located on opposite sides of their respective connector ports.

15. A semiconductor apparatus comprising:
   a substrate including a peripheral edge;
   a plurality of devices situated on the substrate adjacent the peripheral edge, each device including a first end and a second end opposite the first end;
   each device including a connector port located between the first and second end of that device; and
   a plurality of bonding pads, each of the plurality of bonding pads being coupled by a respective connector to a connector port.

16. The semiconductor apparatus of claim 15 wherein the respective connectors exhibit respective connection paths that are of approximately equal length.

17. The semiconductor apparatus of claim 16 wherein the respective connection paths include a plurality of metal layers.

18. The semiconductor apparatus of claim 15 wherein the plurality of bonding pads are located atop a region of the substrate which is substantially covered with devices.

19. The semiconductor apparatus of claim 15 wherein the plurality of devices includes I/O devices.

20. The semiconductor apparatus of claim 15 wherein a plurality of the devices are situated adjacent each other on the substrate, whereby any two adjacent devices have their respective bonding pads located on opposite sides of their respective connector ports.

21. The semiconductor apparatus of claim 15 wherein the first end of the plurality of devices is situated immediately adjacent the peripheral edge.

* * * * *